United States Patent
Ichimura (10) Patent No.: US 9,584,094 B2
(45) Date of Patent: Feb. 28, 2017

(54) PIEZOELECTRIC VIBRATING REED AND PIEZOELECTRIC VIBRATOR

(71) Applicant: SII Crystal Technology Inc., Chiba-shi, Chiba (JP)

(72) Inventor: Naoya Ichimura, Chiba (JP)

(73) Assignee: SII CRYSTAL TECHNOLOGY INC., Chiba (JP)

( * ) Notice: Subject to any disclaimer, the term of this patent is extended or adjusted under 35 U.S.C. 154(b) by 0 days.

(21) Appl. No.: 15/002,670

(22) Filed: Jan. 21, 2016

(65) Prior Publication Data

US 2016/0218694 A1 Jul. 28, 2016

(30) Foreign Application Priority Data

Jan. 26, 2015 (JP) .................. 2015-012541

(51) Int. Cl.
*H03H 9/21* (2006.01)
*H01L 41/053* (2006.01)
*H03H 9/10* (2006.01)

(52) U.S. Cl.
CPC .............. *H03H 9/21* (2013.01); *H01L 41/053* (2013.01); *H03H 9/1014* (2013.01)

(58) Field of Classification Search
CPC .... H03H 9/21; H03H 9/215; H03H 2003/026; H03H 2003/0492; H03H 9/2468; H03H 9/2473; H03H 9/2484; H03H 9/2494; B06B 1/0659; G01C 19/5607
USPC ....................................... 310/370
See application file for complete search history.

(56) References Cited

U.S. PATENT DOCUMENTS

| | | | | |
|---|---|---|---|---|
| 2006/0082261 | A1* | 4/2006 | Tanaya .............. | G01C 19/5607 310/370 |
| 2010/0084949 | A1* | 4/2010 | Ichikawa ................ | H03H 3/04 310/370 |
| 2010/0096953 | A1* | 4/2010 | Iwai ........................ | H03H 9/21 310/370 |
| 2014/0029179 | A1* | 1/2014 | Yamada ................... | H03H 9/21 361/679.01 |
| 2015/0137901 | A1* | 5/2015 | Yamada ................. | H03H 9/215 331/156 |

FOREIGN PATENT DOCUMENTS

| | | |
|---|---|---|
| JP | 2008-219066 A | 9/2008 |
| JP | 5341647 B2 * | 11/2013 |

* cited by examiner

Primary Examiner — J. San Martin
(74) Attorney, Agent, or Firm — Brinks Gilson & Lione (57) ABSTRACT

A pair of vibrating arms are arranged side by side in a second direction crossing the first direction, base end sides of which in the first direction are fixed to the base, a pair of inclined surfaces are formed in both sides of the base end of the vibrating arm in the second direction, an end portion in the base end side of an inner inclined surface is connected to an end surface in the tip end side of the base, and an end portion in the base end side of an outer inclined surface is connected to an end surface of the base in the second direction, and the base-end side end portion of the outer inclined surface is arranged closer to the tip end side than the base-end side end portion of the inner inclined surface.

8 Claims, 7 Drawing Sheets

PIEZOELECTRIC VIBRATING REED AND PIEZOELECTRIC VIBRATOR

RELATED APPLICATIONS

This application claims priority under 35 U.S.C. §119 to Japanese Patent Application No. 2015-012541 filed on Jan. 26, 2015, the entire content of which is hereby incorporated by reference.

BACKGROUND OF THE INVENTION

1. Field of the Invention

The present invention relates to a piezoelectric vibrating reed and a piezoelectric vibrator.

2. Description of the Related Art

In a cellular phone or a portable information terminal device, a piezoelectric vibrator formed of a crystal or the like is used as a time source, a timing source of a control signal, a reference signal source and so on. As one of these types of piezoelectric vibrators, a piezoelectric vibrator which houses a piezoelectric vibrating reed in a vacuum sealed cavity is known. In the piezoelectric vibrator, a voltage is applied to an excitation electrode formed in vibrating arms, thereby vibrating the vibrating arms with a predetermined resonance frequency.

Incidentally, inclined surfaces (tapers) are formed at base end portions of vibrating arms connecting to a base in the piezoelectric vibrating reed. The effect of improving the strength in the vibrating arms can be expected by this structure.

Figure 1:
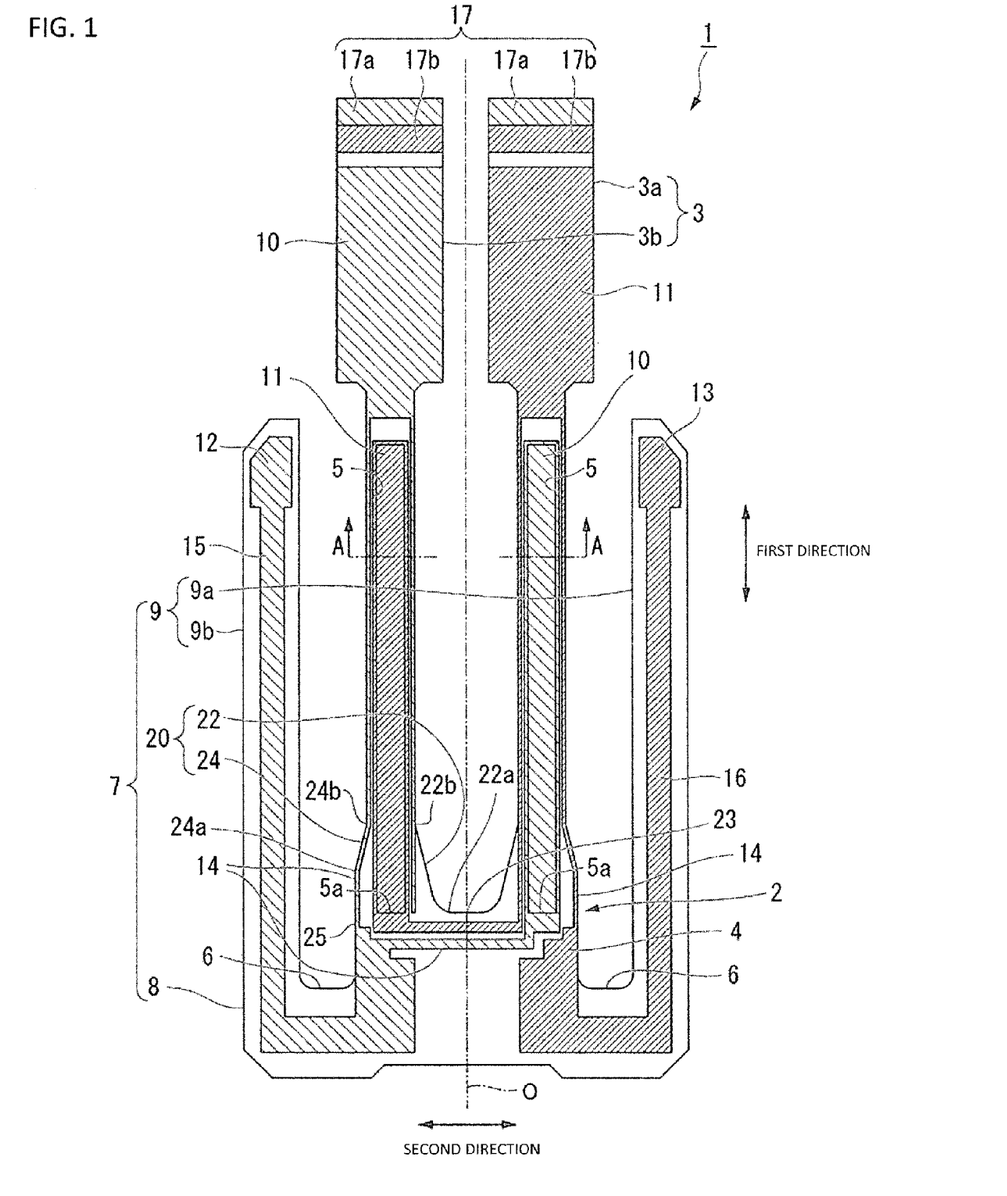
FIG. 1 is a plan view showing a structure of a surface side of a piezoelectric vibrating reed according to a first embodiment.

As disclosed in, for example, JP-A-2008-219066 (Patent Document 1), there is known a type of piezoelectric vibrator in which a pair of support arms are provided so as to extend from a base to which a pair of vibrating arms are connected to both sides of the vibrating arms and the piezoelectric vibrating reed is mounted by the vicinity of tip ends of these support arms. The piezoelectric vibrating reed has a pair of inclined surfaces which are approximately symmetrical with respect to a center line which equally divides the vibrating arm in the width direction at the base end portion of the vibrating arm as shown in FIG. 1 of the document.

SUMMARY OF THE INVENTION

However, when the approximately symmetrical inclined surfaces are formed in the base end portions of the vibrating arms, the width of the base is increased. Accordingly, it is difficult to reduce the size of the piezoelectric vibrating reed and the piezoelectric vibrator which houses the piezoelectric vibrating reed due to the constraint in the width of the base.

In view of the above, an object of the present invention is to provide a piezoelectric vibrating arm and a piezoelectric vibrator capable of improving the strength and reducing the size.

According to an embodiment of the present invention, there is provided a piezoelectric vibrating reed including vibrating arms extending along a first direction and a base fixing a pair of vibrating arms, in which the pair of vibrating arms are arranged side by side in a second direction crossing the first direction, base end sides of which in the first direction are fixed to the base, and tip end sides of which in the first direction can vibrate, a pair of inclined surfaces are formed in both sides of the base end side of the vibrating arm in the second direction so that the width of the vibrating arm in the second direction is gradually increased from the tip end side toward the base end side, a base-end side end portion in the base end side of an inner inclined surface arranged in the inner side of the pair of inclined surfaces in the second direction is connected to an end surface in the tip end side of the base, and a base-end side end portion in the base end side of an outer inclined surface arranged in the outer side of the pair of inclined surfaces in the second direction is connected to an end surface of the base in the second direction, and the base-end side end portion of the outer inclined surface is arranged closer to the tip end side than the base-end side end portion of the inner inclined surface.

According to the present invention, the base-end side end portion of the outer inclined surface is arranged closer to the tip end side than the base-end side end portion of the inner inclined surface, therefore, the width of the base in the second direction can be narrowed as compared with the related art in which the outer inclined surface and the inner inclined surface are formed to be approximately symmetrical with respect to the center line of the vibrating arm. Therefore, it is possible to improve the strength and to reduce the size of the piezoelectric vibrating reed.

A tip-end side end portion in the tip end side of the outer inclined surface and a tip-end side end portion in the tip end side of the inner inclined surface may be arranged in the same position in the first direction.

According to the present invention, the symmetry in an area closer to the tip end side than the area where the outer inclined surface and the inner inclined surface are formed in the vibrating arms can be secured. That is, in the case where respective tip-end side end portions of the outer inclined surface and the inner inclined surface are formed in different positions in the first direction, it is difficult to obtain the symmetry of a so-called straight portion closer to the tip end side than the area where the inclined surfaces are formed, as a result, vibration characteristics of bending vibration may be reduced. However, it is possible to maintain vibration characteristics of the vibrating arms in good condition when the symmetry is secured as in the present invention.

The outer inclined surface and a part of the inner inclined surface may be formed to be approximately symmetrical with respect to a center line equally dividing the vibrating arm in the second direction.

According to the present invention, the symmetry of the vibration arm in the area where the inclined surfaces are formed can be secured. Accordingly, the symmetry in the vibrating arms performing bending vibration can be secured. Here, "approximate symmetry" means that not only strict symmetry but also symmetries with differences in inclined angles within design tolerance are regarded as symmetries. For example, a case where inclined angles with respect to the center line equally dividing the vibrating arm in the second direction differ between the outer inclined surface and the inner inclined surface by approximately three degrees, it is possible to regard the inner inclined surface and the outer inclined surface to be "symmetrical" with respect to the center line of the vibrating arm.

Moreover, groove portions may be formed on front and back surfaces of the vibrating arms so as to extend in the first direction, a base-end side groove end portion of the groove portion may be arranged closer to the base end side than the base-end side end portion of the outer inclined surface, and a first excitation electrode formed in the end surface of the base in the second direction and a second excitation electrode formed in an inner wall surface of the groove portion may be arranged so as to face each other.

According to the present invention, the groove portions are formed on front and back surfaces of the vibrating arms, the base-end side groove end portion of the groove portion is arranged closer to the base end side than the base-end side end portion of the outer inclined surface, and the first excitation electrode formed in the end surface of the base and the second excitation electrode formed in the inner wall surface of the groove portion are arranged so as to face each other, the width between the inner wall surface of the groove portion and the end surface of the base is narrowed as the width of the base in the second direction is narrowed as compared with the related art in which the inclined surfaces are formed to be approximately symmetrical with respect to the center line of the vibrating arm. Accordingly, the piezoelectric vibrating reed having the groove portion can improve electric field efficiency in the vicinity of the outer inclined surface.

The piezoelectric vibrating reed may further include a pair of support arms respectively extending along the first direction in outer sides of the pair of vibrating arms in the second direction and connecting portions connecting the base to the support arms, in which mount electrodes electrically connected to the outside may be formed in the pair of support arms.

According to the present invention, the piezoelectric vibrating reed can be mounted on a package and so on through the mount electrodes of the support arms, therefore, the distance between the vibrating arm and the mount electrode of the support arm can be secured to be long. Accordingly, the vibration leakage can be suppressed without increasing the full length of the piezoelectric vibrating reed. Therefore, the vibration leakage can be suppressed while realizing further reduction in size of the piezoelectric vibrating reed.

The piezoelectric vibrating reed may further include a support arm extending along the first direction in inner side of the pair of vibrating arms in the second direction, in which mount electrodes electrically connected to the outside may be formed in the support arm.

According to the present invention, the piezoelectric vibrating reed can be mounted on a package and so on through the mount electrodes of the support arm, therefore, the distance between the vibrating arm and the mount electrode of the support arm can be secured to be long. Accordingly, the vibration leakage can be suppressed without increasing the full length of the piezoelectric vibrating reed. Furthermore, one support arm is arranged between the pair of vibrating arms in the piezoelectric vibrating reed, therefore, the width in the second direction can be narrowed as compared with the structure in which a pair of support arms are arranged in the outer sides of a pair of vibrating arms. Therefore, the vibration leakage can be suppressed while realizing further reduction in size of the piezoelectric vibrating reed.

Furthermore, mount electrodes electrically connected to the outside may be formed in the base.

According to the present invention, the piezoelectric vibrating reed can be mounted on a package and so on through the mount electrodes of the base, the support arm extending from the base is not necessary, and the width of the base in the second direction can be reduced. Therefore, further reduction in size of the piezoelectric vibrating reed can be realized.

The piezoelectric vibrator of the present invention includes a package including a base substrate and a lid substrate bonded to each other, which houses the piezoelectric vibrating reed in a cavity formed between the both substrates.

According to the present invention, the piezoelectric vibrating reed having the base with a narrower width as compared with related art is provided, the reduction in size of the package can be achieved.

According to the present invention, the base-end side end portion of the outer inclined surface is arranged closer to the tip end side than the base-end side end portion of the inner inclined surface, therefore, the width of the base in the second direction can be narrowed as compared with related art in which the outer inclined surface and the inner inclined surface are formed to be approximately symmetrical. Therefore, the reduction in size of the piezoelectric vibrating reed can be realized.

DETAILED DESCRIPTION OF THE PREFERRED EMBODIMENTS

Hereinafter, embodiments of the present invention will be explained with reference to the drawings.

First Embodiment

FIG. 1 is a plan view of a surface side of a piezoelectric vibrating reed 1. In the embodiment, a tuning-fork type piezoelectric vibrating reed with groove portions will be explained as the piezoelectric vibrating reed 1 as an example.

As shown in FIG. 1, the piezoelectric vibrating reed 1 includes a tuning-fork type piezoelectric plate 2 formed of a piezoelectric material such as crystal, lithium tantalite, lithium niobate or the like.

The piezoelectric plate 2 includes a vibrating portion 3 formed so as to extend along a direction parallel to a central axis O (hereinafter, referred to as a first direction) and a base 4 supporting a base end portion of the vibrating portion 3. The vibrating portion 3 has a pair of vibrating arms 3a and 3b which are arranged side by side in a direction orthogonal to the central axis O (hereinafter referred to as a second direction). The pair of vibrating arms 3a and 3b are arranged so as to extend along the first direction. A width of each of the first vibrating arms 3a and 3b at the tip end side in the second direction is wider than a width of the base end side in the second direction.

The base 4 connects one end portions of the pair of vibrating arms 3a and 3b in the first direction. A support portion 7 is connected to the base 4 through connecting portions 6. The support portion 7 includes support bases 8 and a support arm portion 9 (a pair of support arms 9a and 9b).

The connecting portions 6 are provided between the base 4 and the support bases 8. The connecting portions 6 extend from both end surfaces of the base 4 in the second direction toward outer sides in the second direction and are connected to the support bases 8. The pair of support arms 9a and 9b respectively extend from the support bases 8 along the first direction. The pair of support arms 9a and 9b are arranged in both sides of the vibrating portion 3 in the second direction. The piezoelectric vibrating reed 1 in the embodiment is a so-called side arm type piezoelectric vibrating reed in which the vibrating portion 3 is arranged between the pair of support arms 9a and 9b in the second direction.

Figure 2:
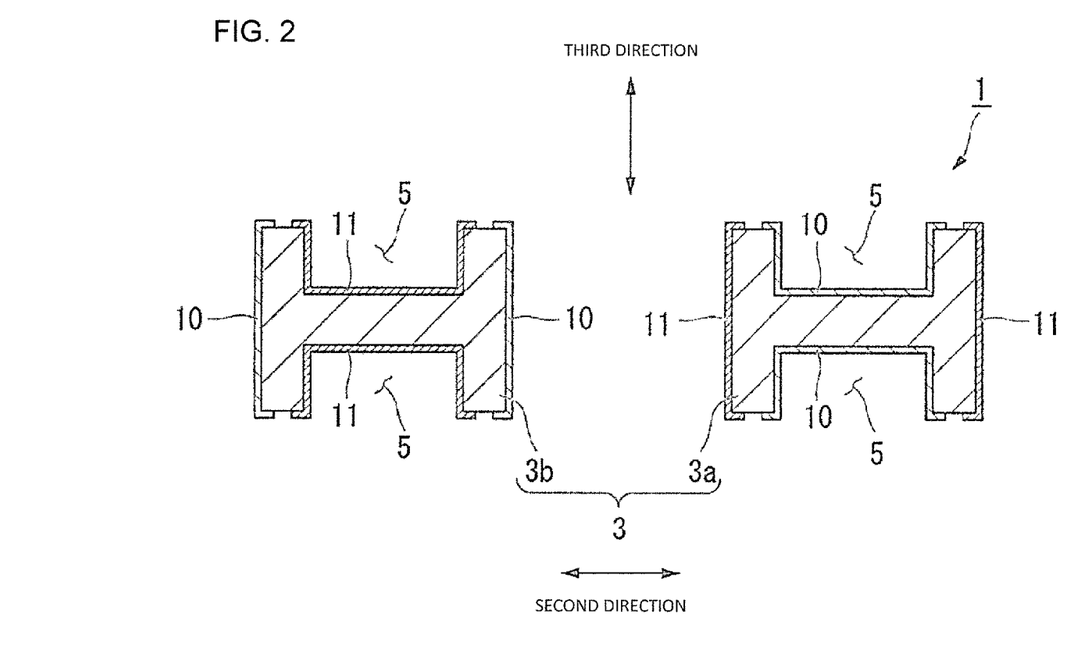
FIG. 2 is a cross-sectional view showing a structure taken along A-A cross section in FIG. 1.

FIG. 2 is a cross-sectional view taken along A-A line of FIG. 1.

As shown in FIG. 1 and FIG. 2, groove portions 5 each having a fixed width are formed on main surfaces (front and back surfaces) of the pair of vibrating arms 3a and 3b so as to extend from base end portions toward tip end portions of the vibrating arms 3a and 3b. The groove portions 5 are formed over a range from the base end portion side to an intermediate part of the vibrating arms 3a and 3b. Each of the pair of vibrating arms 3a and 3b has an H-shape in cross section as shown in FIG. 2. The details of an area in the base end side where the groove portions 5 are formed will be explained later.

As shown in FIG. 1, on an outer surface of the piezoelectric plate 2, a pair of excitation electrodes 10 and 11, and a pair of mount electrodes 12 and 13 are respectively formed. In the above components, the pair of excitation electrodes 10 and 11 are electrodes which vibrate the pair of the vibrating arms 3a and 3b with a predetermined resonance frequency in a direction approaching each other or separating from each other when a voltage is applied, which are patterned in a state of being electrically disconnected to each other on outer surfaces of the pair of vibrating arms 3a and 3b.

Specifically, one excitation electrode 10 is chiefly formed in the groove portion 5 of one vibrating arm 3a and a side surface of the other vibrating arm 3b, and the other excitation electrode 11 is chiefly formed in groove portion 5 of the other vibrating arm 3b and a side surface of one vibrating arm 3a.

The pair of excitation electrodes 10 and 11 are electrically connected to base extraction electrodes 14 formed on outer surfaces including a main surface and side surfaces of the base 4, respectively. The pair of mount electrodes 12 and 13 are provided in tip end portions on main surfaces of the pair of support arms 9a and 9b. The pair of mount electrodes 12 and 13 are electrically connected from the base extraction electrodes 14 through arm extraction electrodes 15 and 16. The arm extraction electrodes 15 and 16 are respectively formed along the connecting portion 6, the support base 8, and main surfaces of the support arms 9a and 9b. According to the above structure, a voltage is applied to the pair of excitation electrodes 10 and 11 through the pair of mount electrodes 12 and 13.

The above excitation electrodes 10, 11, the mount electrodes 12, 13, the base extraction electrodes 14 and the arm extraction electrodes 15, 16 are stacked films including, for example, chromium (Cr) and gold (Au), which are formed by applying a gold thin film on the surface after depositing a chrome film which has good adhesion with respect to crystal as a base. However, the present invention is not limited to the above, and it is also possible to further stack the gold thin film on the surface of the stacked film including, for example, chrome and Nichrome (NiCr) and it is also possible to form a single layer film including, for example, chrome, nickel, aluminum (Al) or titanium (Ti).

In tip end portions of the pair of vibrating arms 3a and 3b, weight metal films 17 (a coarse adjustment film 17a and a fine adjustment film 17b) are formed for adjusting vibrating states of the arms so as to vibrate within a given range of frequencies (frequency adjustment) as shown in FIG. 1. Frequencies of the pair of vibrating arms 3a and 3b can fall into a range of a nominal frequency of the device by adjusting frequencies using the weight metal films 17.

In the embodiment, a pair of inclined surfaces 20 are formed on both sides of each of the vibrating arms 3a and 3b in the second direction in the base end side. The inclined surfaces 20 are formed so that the width of each of the vibrating arms 3a and 3b in the second direction is increased from the tip end side toward the base end side.

Figure 3:
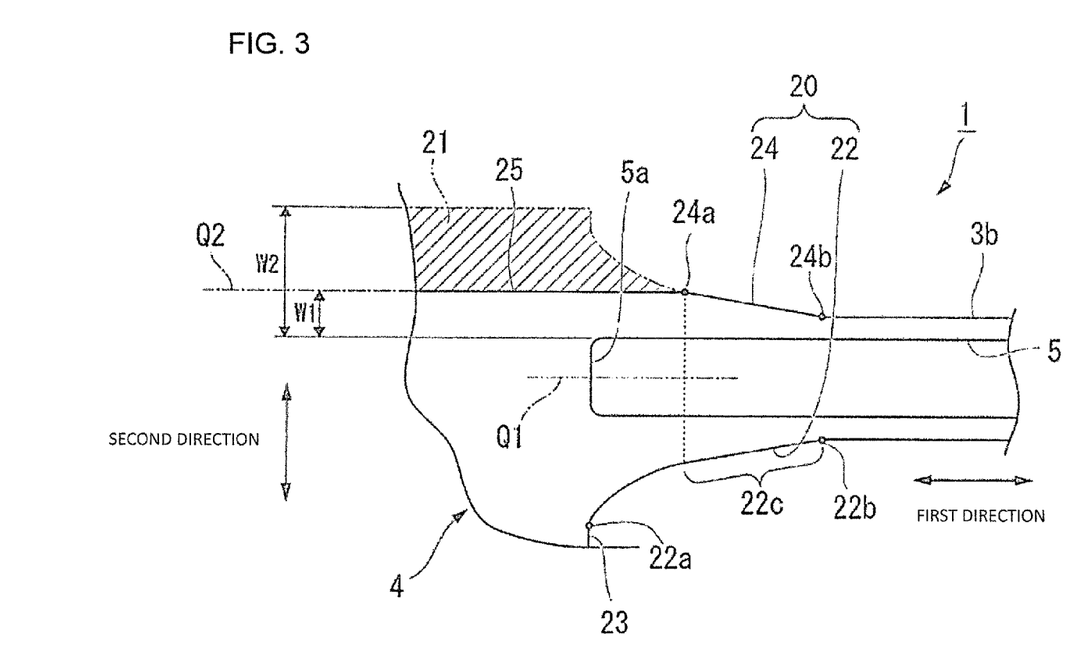
FIG. 3 is a schematic view showing inclined surfaces shown in FIG. 1 with a virtual outer portion.

FIG. 3 is a schematic view showing the inclined surfaces 20 shown in FIG. 1 with a virtual outer portion 21. In FIG. 3, an outer shape of the virtual outer portion 21 is shown by a two-dot chain line.

A base-end side end portion 22a in the base end side of an inner inclined surface 22 arranged in the inner side of the pair of inclined surfaces 20 in the second direction is connected to an end surface 23 in the tip end side of the base 4. A base-end side end portion 24a in the base end side of an outer inclined surface 24 arranged in the outer side of the pair of inclined surfaces 20 in the second direction is connected to an end surface 25 of the base in the second direction.

The base-end side end portion 24a of the outer inclined surface 24 is arranged closer to the tip end side than the base-end side end portion 22a of the inner inclined surface 22. A tip-end side end portion 24b in the tip end side of the outer inclined surface 24 and a tip-end side end portion 22b in the tip end side of the inner inclined surface 22 are arranged in the same position in the first direction. The outer inclined surface 24 and a part 22c in the tip end side of the inner inclined surface 22 are formed to be approximately symmetrical with respect to a center line Q1 which equally divides each of the vibrating arms 3a and 3b in the second direction in plan view.

The outer inclined surface 24 and the inner inclined surface 22 can be straight lines in plan view shown in FIG. 3 (the straight lines in this case are regarded as "straight lines" not only in a case of a strict straight line but also when straight lines have slight roughness not intentionally formed in a manufacturing process as long as they can be regarded as straight lines in broad perspective. Hereinafter, the definition of the "straight lines" follows this.). The outer inclined surface 24 and the inner inclined surface 22 can be folding lines in which plural straight lines inclined angles of which are gradually changed are continued in plan view shown in FIG. 3. The outer inclined surface 24 and the inner inclined surface 22 can be also curved lines curvature of which are gradually decreased toward the base 4 in plan view shown in FIG. 3. Furthermore, the outer inclined surface 24 and the inner inclined surface 22 can be lines in which the straight lines or the folding lines and the curved lines are continued in plan view shown in FIG. 3.

Here, a base-end side groove end portion 5a of the groove portion 5 is arranged closer to the base end side than the base-end side end portion 24a of the outer inclined surface 24. The excitation electrode 10 (11) formed in part of the base 4 in the tip end side of the end surface 25 in the second direction and the excitation electrode 11 (10) formed in an inner wall surface of the groove portion 5 are arranged so as to face each other (concerning the excitation electrodes 10 and 11, see FIG. 2). Therefore, a width W1 between the inner wall surface of the groove portion 5 and the end surface 25 of the base 4 is narrower than a width W2 between the inner wall surface of the groove portion 5 and the end surface of the base in related art as the width of the base 4 in the second direction becomes narrow. Accordingly, the electric field efficiency in the vicinity of the outer inclined surfaces 24 is improved in the piezoelectric vibrating reed 1 having the groove portions 5.

Next, the operation of the piezoelectric vibrating reed 1 will be explained.

In the piezoelectric vibrating reed 1, the pair of inclined surfaces 20 the width of which in the second direction is gradually increased toward the base end side is formed in both sides of each of the vibrating arms 3a and 3b in the second direction. In the inclined surfaces 20, the width of a connecting portion of each of the vibrating arms 3a and 3b with respect to the base 4 is gradually increased. Accordingly, the impact resistance of the vibrating arms 3a and 3b is increased. As the impact resistance is increased, it has been found that a crystal impedance value (hereinafter, referred to as a "CI value") of the piezoelectric vibrating reed 1 is reduced by inventors' earnest study.

Incidentally, the tip end sides of the vibrating arms 3a and 3b are displaced in the second direction, therefore, all inclined surface 20 are formed so as to be approximately symmetrical for the purpose of keeping the vibration balance in related art. However, when the inclined surfaces 20 are formed so that the widths thereof are gradually increased in the state where the inclined surfaces 20 are approximately symmetrical, the width of the base 4 in the second direction is increased. The width increase of the base 4 will be a problem for reducing the size. It is requested that the width of the base 4 is reduced for suppressing the vibration leakage. In response to this, there exists a base 4 having a narrowed part (so-called notch), however, the shape will be complicated in this case.

Accordingly, in the piezoelectric vibrating reed 1 according to the embodiment, the base-end side end portion 24a in the outer inclined surface 24 is arranged closer to the tip end side of the base-end side end portion 22a of the inner inclined surface 22. That is, the outer inclined surface 24 has a shape obtained by removing a portion (the virtual outer portion 21; a hatched area) in the outer side of a virtual line Q2 along the first direction shown in FIG. 3 in the inclined surfaces 20 which are approximately symmetrical. Note that "removing" is not limited to the meaning of "cutting" but includes a case where the portion is originally formed in that shape. The position of the virtual line Q2 is a position extending along the end surface 25 of the base 4 in the second direction. The base 4 can be formed so that the width in the second direction is narrowed as the virtual outer portion 21 is not necessary.

In this case, the inner inclined surface 22 and the outer inclined surface 24 are not approximately symmetrical as a whole with respect to the center line equally dividing each of the vibrating arms 3a and 3b in the second direction. However, it has been found that the piezoelectric vibrating reed 1 according to the embodiment has advantages in vibration characteristics by narrowing the width of the base 4. Accordingly, the piezoelectric vibrating reed 1 can suppress the vibration leakage by a simple shape without a notch and can be reduced in size. Furthermore, the strength of the vibrating arms 3a and 3b can be secured.

Also in the piezoelectric vibrating reed 1, the groove portions 5 are formed in front and back surfaces of the vibrating arms 3a and 3b. The vibrating arms 3a and 3b are bent and vibrate as electric fields are formed in inner wall surfaces of the groove portions 5 and end surfaces (including the outer inclined surfaces 24) of the base 4 in the second direction. When the width between the inner wall surface of the groove portion 5 and the end surface of the base 4 is wide, the electric field efficiency is reduced. In the piezoelectric vibrating reed 1 according to the embodiment, the width W1 between the inner wall surface of the groove portion 5 and the end surface 25 of the base 4 is narrower than a width W2 between the inner wall surface of the groove portion and the end surface of the base in related art as the width of the base 4 in the second direction becomes narrow. Accordingly, the electric field efficiency in the vicinity of the outer inclined surfaces 24 in the piezoelectric vibrating reed 1 having the groove portions 5 is particularly improved by removing the virtual outer portion 21. As a result, the CI value is reduced and power saving is realized. It has also been found by inventors' earnest study that the improvement of electric field efficiency in the vicinity of the base end portions of the vibrating arms 3a and 3b can promote the improvement of vibration characteristics as compared with the case of improving the electric field efficiency in the tip end portions of the vibrating arms 3a and 3b. Specifically, it is possible to expect effects such that desired frequencies are stably obtained and that the CI value is reduced.

The above piezoelectric vibrating reed 1 can be mounted on a package and so on through the mount electrodes 12 and 13 in the support arm portion 9. The piezoelectric vibrating reed 1 can secure the distance between the connecting portions 6 and the mount electrodes 12 and 13 of the support arm portion 9 to be long in the base 4. Accordingly, the vibration leakage can be suppressed without increasing the full length of the piezoelectric vibrating reed 1. As a result, it is possible to suppress the increase of the CI value and to suppress the reduction in quality of output signals. Then, the base 4 can be formed so that the width in the second direction is narrowed as the virtual outer portions 21 in respective vibrating arms 3a and 3b are not necessary.

Figure 4:
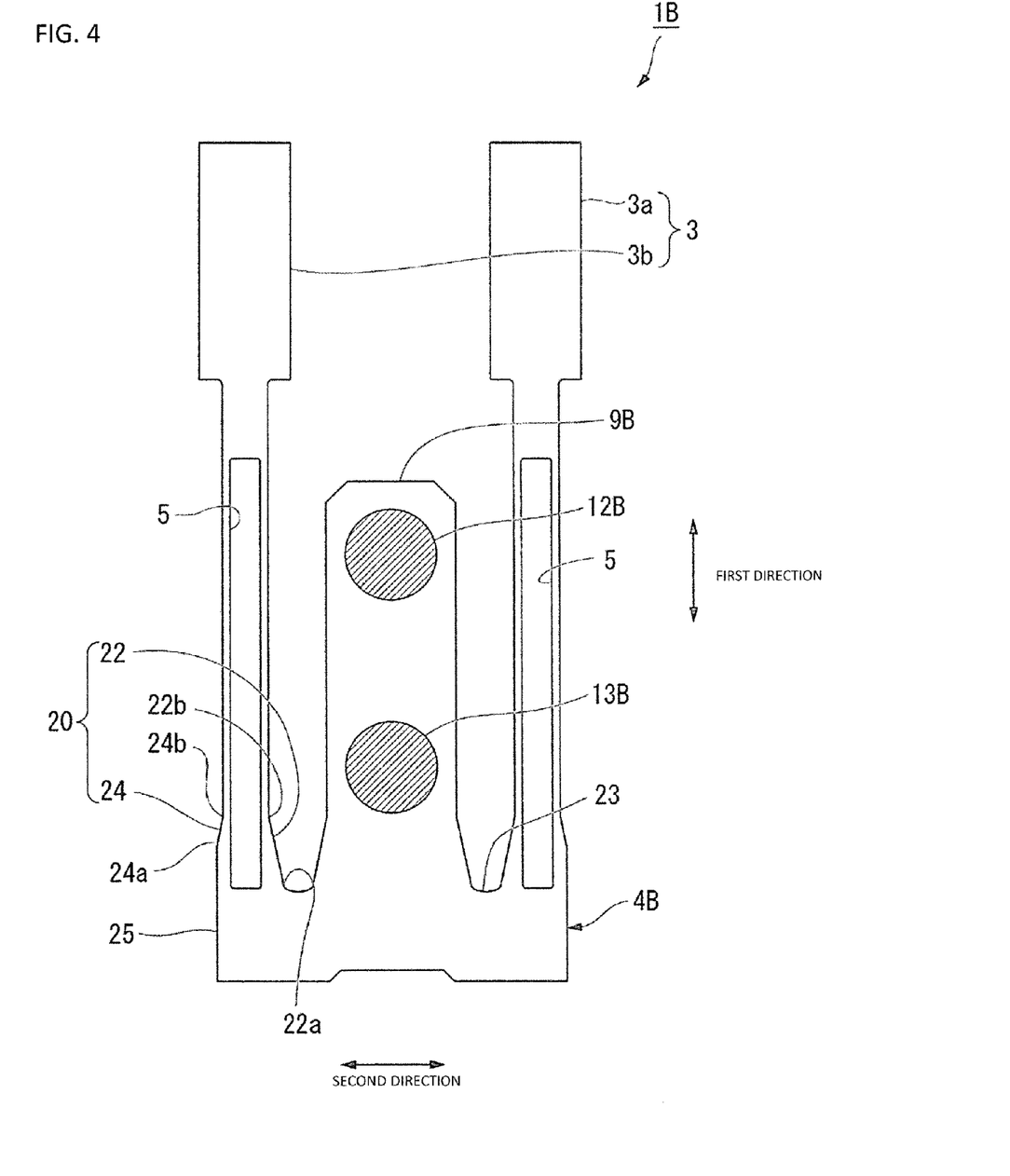
FIG. 4 is a plan view showing a structure of a surface side of a piezoelectric vibrating reed according to a first modification example of the first embodiment.

Next, a piezoelectric vibrating reed 1B according to a first modification example of the first embodiment will be explained.

FIG. 4 is a plan view showing a structure in the surface side of the piezoelectric vibrating reed 1B according to the first modification example of the first embodiment. In the flowing explanation, the same symbols are given to components which are common to the above components, and the explanation thereof is omitted. As the excitation electrodes 10, 11, the mount electrodes 12, 13 in the drawing have the same structures as those of the above embodiment, they are not shown.

In the piezoelectric vibrating reed 1B according to a first modification example, a support arm portion 9B is formed in the end surface 23 in the tip end side of a base 4B between the pair of vibrating arms 3a and 3b. The piezoelectric vibrating reed 1B according to the first modification example is a so-called center arm type piezoelectric vibrating reed in which the support arm portion 9B is formed so as to extend along the first direction toward the tip end side. Mount electrodes 12B and 13B are formed in the support arm portion 9B.

The piezoelectric vibrating reed 1B can be mounted on, for example, a package and so on through the support arm portion 9B. The piezoelectric vibrating reed 1B can secure the distance between the vibrating arms 3a, 3b and the mount electrodes 12B, 13B of the support arm portion 9B to be long. Accordingly, the vibration leakage can be suppressed without increasing the full length of the piezoelectric vibrating reed 1B. As a result, it is possible to suppress the increase of the CI value and to suppress the reduction in quality of output signals.

Furthermore, as one support arm portion 9B is arranged between the pair of vibrating arms 3a and 3b, the piezoelectric vibrating piece 1B can be formed so that the width in the second direction is narrowed as compared with the structure in which a pair support arms is arranged in the outer side. Then, a base 4B can be formed so that the width in the second direction is narrowed as the virtual outer portions 21 of respective vibrating arms 3a and 3b are not necessary.

Figure 5:
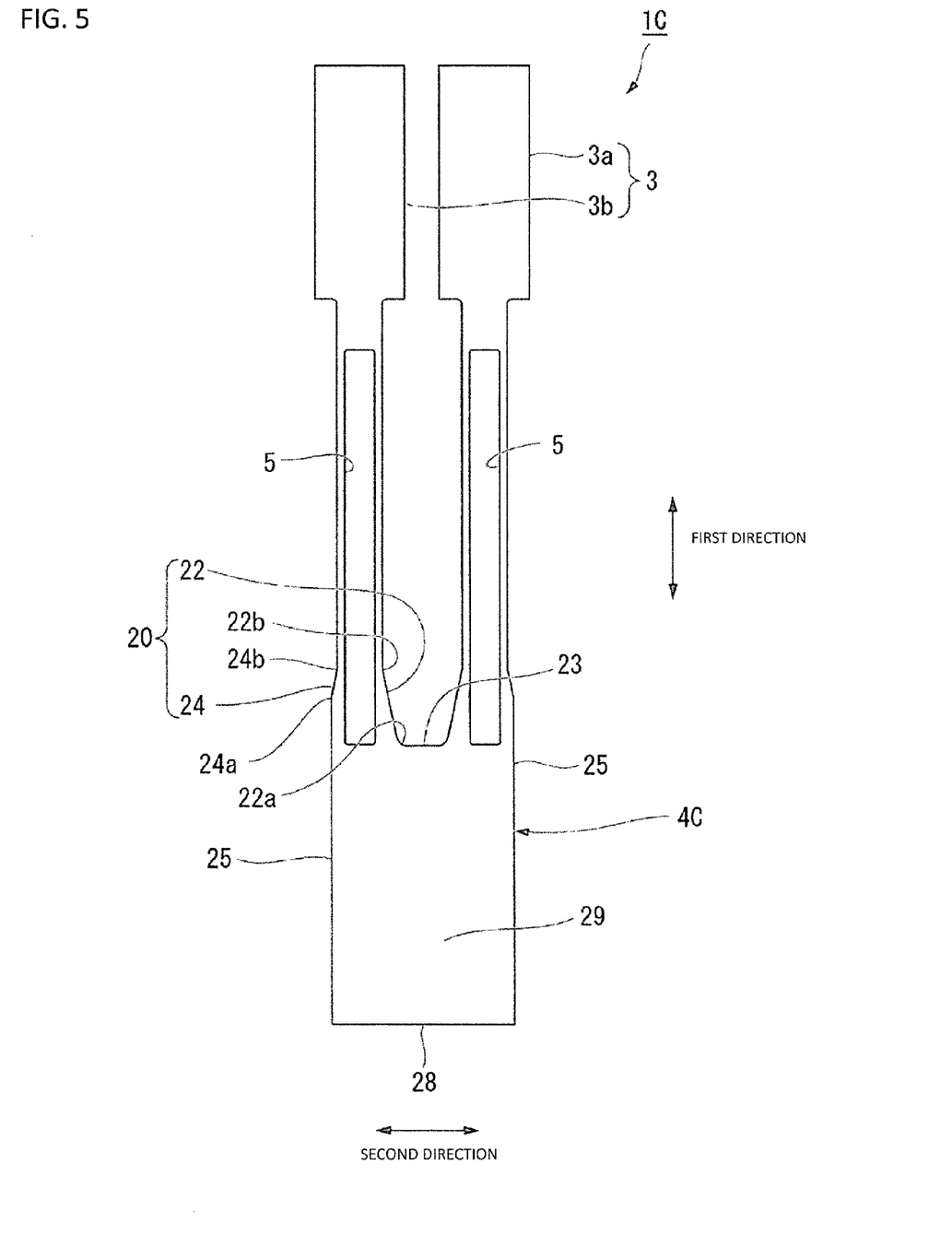
FIG. 5 is a plan view showing a structure of a surface side of a piezoelectric vibrating reed according to a second modification example of the first embodiment.

Next, a piezoelectric vibrating reed 1C according to a second modification example of the first embodiment will be explained.

FIG. 5 is a plan view showing a structure of the surface side of the piezoelectric vibrating reed 1C according to the second modification example of the first embodiment.

In the piezoelectric vibrating reed 1C according to the second modification example, a base 4C is formed in a square plate shape having a pair of end surfaces 25 in the second direction, the end surface 23 in the tip end side of the base 4C and an end surface 28 in the rear end side of the base 4C in four edges. The base 4C is provided with a mount electrode (not shown in FIG. 5) which is electrically connected to the outside.

The above piezoelectric vibrating reed 1C can be mounted on, for example, a package and so on through the base 4C. The above piezoelectric vibrating reed 1C can be formed so that the width of the base 4C in the second direction is reduced as the support arms extending from the base 4C are not necessary. Then, the base 4C can be formed so that the width in the second direction is further narrowed as the virtual outer portions 21 of respective vibrating arms 3a and 3b are not necessary.

Second Embodiment

Next, a piezoelectric vibrator 50 having the piezoelectric vibrating reed 1, the piezoelectric vibrating reed 1B or the piezoelectric vibrating reed 1C will be explained. Only the outer shape of the piezoelectric vibrating reed 1 is shown in the drawing, and the excitation electrodes 10, 11, the mount electrodes 12, 13 and so on are not shown as they have the same structures as those of the above embodiment. Even when the piezoelectric vibrating reed 1B or the piezoelectric vibrating reed 1C is mounted, the same explanation can be made, though the explanation is omitted below.

Figure 6:
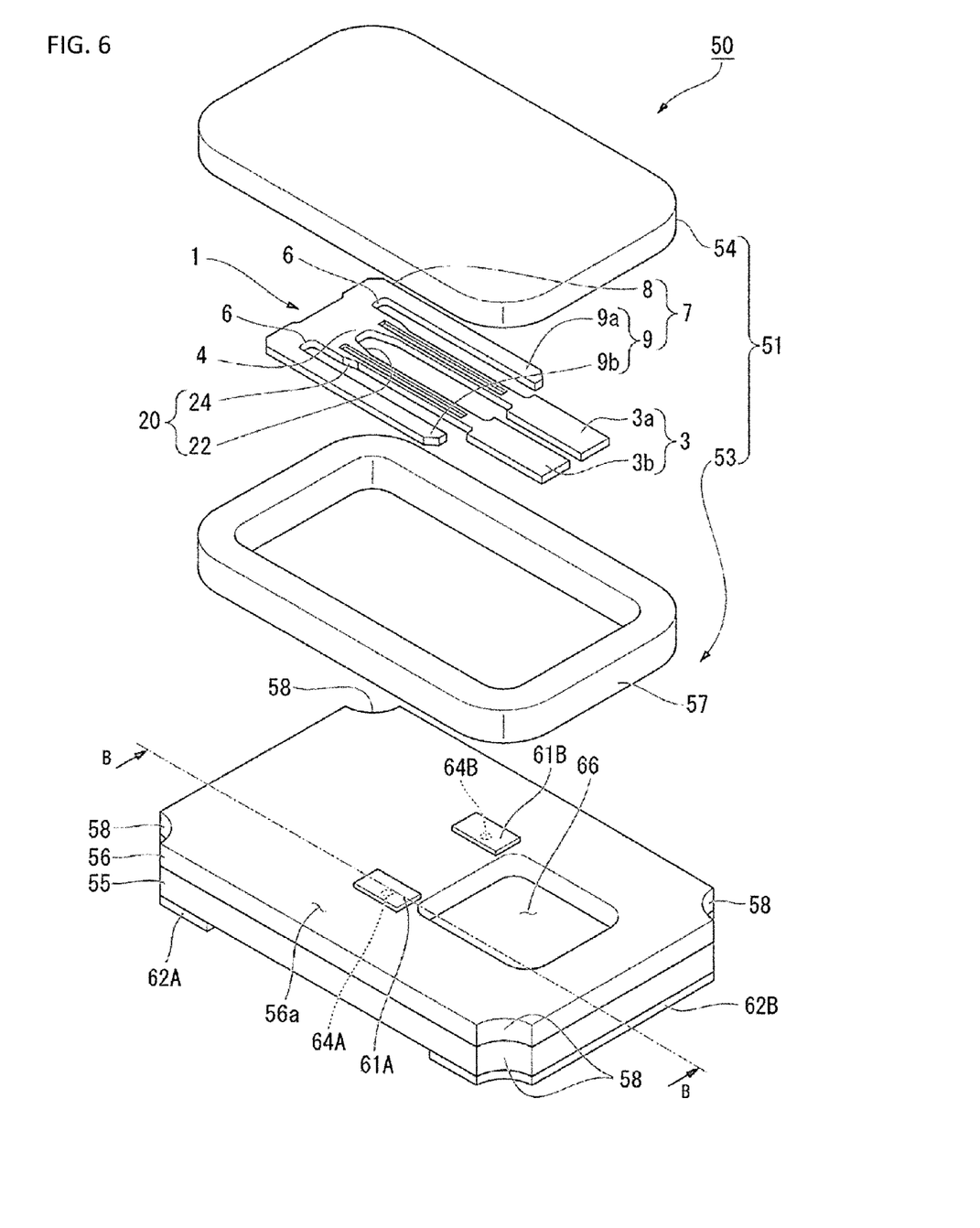
FIG. 6 is an exploded perspective views showing the entire structure of a piezoelectric vibrator according to a second embodiment.
Figure 7:
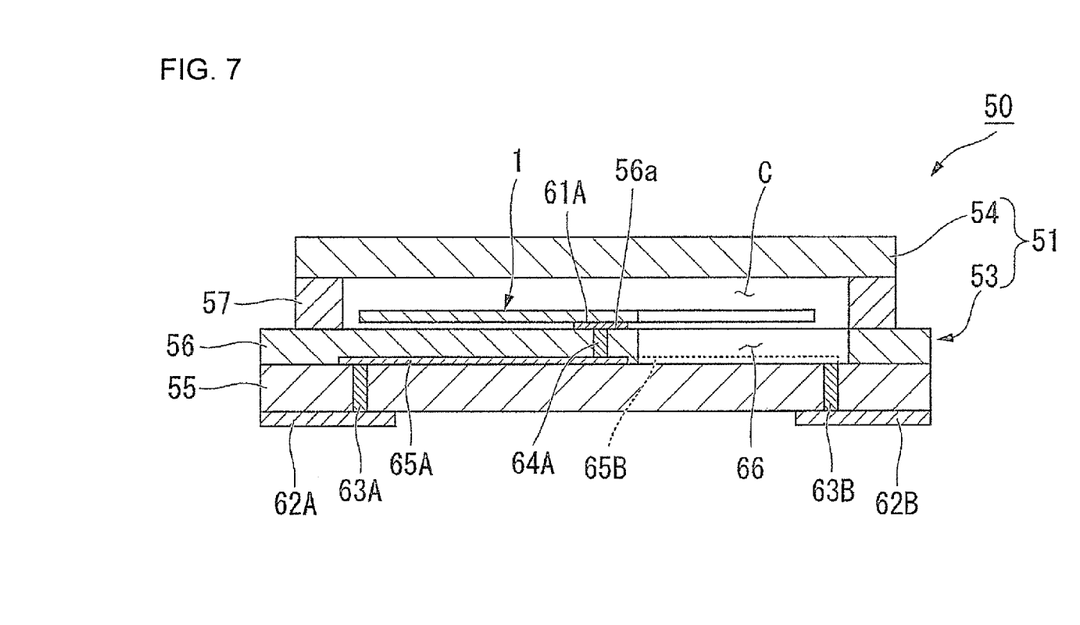
FIG. 7 is a cross-sectional view showing a structure taken along B-B cross section in FIG. 6.

FIG. 6 is an exploded perspective view showing the entire structure of the piezoelectric vibrator 50 according to a second embodiment. FIG. 7 is a cross-sectional view taken along B-B cross section in FIG. 6.

As shown in FIG. 6 and FIG. 7, the piezoelectric vibrator 50 according to the embodiment is a ceramic-package type surface mounted vibrator including a package 51 having a hermetically sealed cavity C thereinside and the above piezoelectric vibrating reed 1 housed in the cavity C.

The piezoelectric vibrator 50 is formed to have an approximately rectangular parallelepiped shape. In the embodiment, a longitudinal direction of the piezoelectric vibrator 50 in plan view is defined as a length direction, a short direction is defined as a width direction and a direction orthogonal to the length direction and the width direction is defined as a thickness direction.

The package 51 includes a package body (base substrate) 53 and a sealing plate (lid substrate) 54 bonded to the package body 53 and forming the cavity C with the package body 53.

The package body 53 includes a first base substrate 55 and a second base substrate 56 which are bonded in an overlapping state, and a sealing ring 57 bonded onto the second base substrate 56.

The first base substrate 55 is a ceramic substrate formed in an approximately rectangular shape in plan view. The second base substrate 56 is a ceramic substrate formed in an approximately rectangular shape in plan view, which is the same outer shape as the first base substrate 55, and is integrally bonded in a state of being stacked on the first base substrate 55 by sintering and so on.

At four corners of the first base substrate 55 and the second base substrate 56, cut-out portions 58 each having a ¼ arc shape in plan view are formed over the entire portions of both substrates 55 and 56 in the thickness direction. The first base substrate 55 and the second base substrate 56 are fabricated by, for example, after stacking two pieces of wafer-shaped ceramic substrates and bonding them to each other, forming plural through holes penetrating through both ceramic substrates in a matrix shape and cutting both ceramic substrates in a lattice shape by using respective through hole as references.

In that case, each through hole is divided into four, thereby forming the above cut-out portions 58. An upper surface of the second base substrate 56 is a mount surface 56a on which the piezoelectric vibrating reed 1 is mounted.

The first base substrate 55 and the second base substrate 56 are made of ceramic. As specific ceramic materials, for example, HTCC (High Temperature Co-Fired Ceramic) made of alumina, LTCC (Low Temperature Co-Fired Ceramic) made of glass ceramic and the like can be cited.

The sealing ring 57 is a conductive frame-like member slightly smaller than the outer shape of the first base substrate 55 and the second base substrate 56, which is bonded to the mount surface 56a of the second base substrate 56.

Specifically, the sealing ring 57 is bonded onto the mount surface 56a by baking using a brazing filler material of silver brazing and so on, a solder material and so on, or bonded by welding with respect to a metal bonding layer formed on the mount surface 56a (formed by, for example, electroplating, electroless plating, deposition, sputtering and so on).

As materials for the sealing ring 57, for example, nickel based alloys and so on can be cited. Specifically, it is possible to select the material from Kovar, Elinvar, Invar, 42-alloy and so on. It is particularly preferable to select the material for the sealing ring 57 having a thermal expansion coefficient close to that of the first base substrate 55 and the second base substrate 56 made of ceramic. For example, when alumina with a thermal expansion coefficient $6.8 \times 10^{-6}/°$ C. is used for the first base substrate 55 and the second base substrate 56, Koval with a thermal expansion coefficient $5.2 \times ^{-6}/°$ C. or 42-alloy with a thermal expansion coefficient 4.5 to $6.5 \times ^{-6}/°$ C. is preferably used for the sealing ring 57.

The sealing plate 54 is a conductive substrate staked onto the sealing ring 57, which is hermetically bonded to the package body 53 by the bonding with respect to the sealing ring 57. A space demarcated by the sealing plate 54, the sealing ring 57 and the mount surface 56a of the second base substrate 56 functions as the cavity C which is hermetically sealed.

As methods of welding the sealing plate 54, for example, seam welding performed by the contact of a roller electrode, laser welding, ultrasonic welding and so on can be cited. It is preferable that a bonding layer such as nickel, gold and so on which are familiar to each other is respectively formed at least on a lower surface of the sealing surface 54 and an upper surface of the sealing ring 57 for welding between the sealing plate 54 and the sealing ring 57 more firmly.

On the mount surface 56a of the second base substrate 56, a pair of electrode pads 61A and 61B as connection connecting to the piezoelectric vibrating reed 1 are formed at an interval in a width direction. On a lower surface of the first base substrate 55, a pair of external electrodes 62A and 62B are formed at an interval in the length direction.

Each of the electrode pads 61A and 61B, the external electrodes 62A and 62B are, for example, a single layer film including a single metal formed by deposition, sputtering and so on, or a stacked film in which different metals are stacked, and these electrodes are electrically connected to one another.

In the first base substrate 55, one first through electrode 63A electrically connected to one external electrode 62A and penetrating through the first base substrate 55 in a thickness direction is formed. In the second base substrate 56, one second through electrode 64A electrically connected to one electrode pad 61A and penetrating through the second base substrate 56 in the thickness direction is formed. One connection electrode 65A connecting one first through electrode 63A to one second through electrode 64A is formed between the first base substrate 55 and the second base substrate 56. Accordingly, one electrode pad 61A and one external electrode 62A are electrically connected to each other.

On the other hand, in the first base substrate 55, the other first through electrode 63B electrically connected to the other external electrode 62B and penetrating through the first base substrate 55 in the thickness direction is formed. In the second base substrate 56, the other second through electrode 64B electrically connected to the other electrode pad 61B and penetrating through the second base substrate 56 in the thickness direction is formed. A second connection electrode 65B connecting the other first through electrode 63B to the other second through electrode 64B is formed between the first base substrate 55 and the second base substrate 56. Accordingly, the other electrode pad 61B and the second external electrode 62B are connected to each other.

The second connection electrode 65B is patterned so as to extend along the sealing ring 57, for example, under the sealing ring 57 for avoiding a later-described concave portion 66.

On the mount surface 56a of the second base substrate 56, the concave portion 66 is formed at a part facing tip end portions of respective vibrating arms 3a and 3b, which is provided for avoiding contact with respect to respective vibrating arms 3a and 3b occurring when respective vibrating arms 3a and 3b are displaced (flexural deformation) in the thickness direction by effects of the impact such as fall. The concave portion 66 is a through hole penetrating through the second base substrate 56, and is formed to be a square shape in plan view having rounded four corners inside the sealing ring 57.

The piezoelectric vibrating reed 1 is mounted so that the mount electrodes 12 and 13 (see FIG. 1) respectively contact the electrode pads 61A and 61B through not-shown metal bumps, a conductive adhesive and so on. Accordingly, the piezoelectric vibrating reed 1 is supported in a state floating above the mount surface 56a of the second base substrate 56 as well as electrically connected to the pair of electrode pads 61A and 61B respectively.

When the piezoelectric vibrator 50 having the above structure is operated, a given drive voltage is applied to the external electrodes 62A and 62B. Accordingly, electric current flows in the excitation electrodes 10 and 11 of the piezoelectric vibrating reed 1, and the pair of vibrating arms 3a and 3b can be vibrated at a given frequency. Then, the piezoelectric vibrator 50 can be used as a time source, a timing source of a control signal, a reference signal source and so on.

As the piezoelectric vibrator 50 according to the embodiment has the high-quality piezoelectric vibrating reed 1 having stable vibration characteristics and capable of reducing the size, the high-quality piezoelectric vibrator 50 with reliability in operation can be obtained. The piezoelectric vibrator 50 includes the piezoelectric vibrating reed 1 having a simple shape, the piezoelectric vibrator 50 manufactured at low costs can be obtained.

The embodiments of the present invention have been explained with reference to the drawings, however, specific configurations are not limited to the embodiments and include design alterations and so on within a scope not departing from the gist of the present invention.

The piezoelectric vibrating reeds 1, 1B and 1C may be provided with a narrowed part (notch) formed by narrowing the width in the second direction in the end surface 25 of respective bases 4, 4B and 4C in the second direction. When the narrowed part is provided, the effect of suppressing the vibration leakage can be further increased in addition to the effect of suppressing the vibration leakage by removing the virtual outer portions 21.

It is possible to appropriately replace the components in the above embodiment with well-known components within a scope not departing from the gist of the present invention.

What is claimed is:

1. A piezoelectric vibrating reed comprising:
   vibrating arms extending along a first direction;
   a base fixing a pair of vibrating arms,
   wherein the pair of vibrating arms reside side by side in a second direction crossing the first direction, base-ends of which in the first direction are fixed to the base, and tip-ends of which in the first direction are free to vibrate,
   inclined surfaces in sides of the base-ends of the vibrating arms in the second direction such that a width of the vibrating arms in the second direction gradually increases from the tip ends toward the base-ends,
   wherein end portions of the base-ends have an inner inclined surface in an inner side of the inclined surfaces in the second direction that are connected to an end surface of the base, and end portions of the base-ends have an outer inclined surface in an outer side of the inclined surfaces in the second direction that are connected to the end surface of the base in the second direction, and
   the portions of the base-ends of the outer inclined surface are closer to the tip-ends than the portions of the base-ends of the inner inclined surface; and
   groove portions on front and back surfaces of the vibrating arms that extend in the first direction,
   wherein the outer inclined surfaces terminate at an inflection point joining parallel surfaces that extend in the first direction and join the base, such that a distance in the second direction between the groove portions and over an entire length of the parallel surfaces is constant.

2. The piezoelectric vibrating reed according to claim 1, wherein an end of the portions in the outer inclined surface toward the tip-ends and an end of the portions in the inner inclined surface toward the tip-ends are at the same position in the first direction.

3. The piezoelectric vibrating reed according to claim 1, wherein the outer inclined surface and a part of the inner inclined surface are approximately symmetrical with respect to a center line equally dividing the vibrating arms in the second direction.

4. The piezoelectric vibrating reed according to claim 1, wherein a base-end side groove end portion of the groove portions is closer to the base-ends than the end portion of the outer inclined surface, and
   a first excitation electrode in an end surface of the base in the second direction and a second excitation electrode in an inner wall surface of the groove portion that face each other.

5. The piezoelectric vibrating reed according to claim 1, further comprising:
   a pair of support arms respectively extending along the first direction on outer sides of the pair of vibrating arms in the second direction; and
   connecting portions connecting the base to the support arms, and mount electrodes,
   wherein the mount electrodes are electrically connected to outside circuitry and reside on the pair of support arms.

6. The piezoelectric vibrating reed according to claim 1, further comprising:
   a support arm extending along the first direction between the pair of vibrating arms, and mount electrodes,
   wherein the mount electrodes are electrically connected to outside circuitry and reside on the support arm.

7. The piezoelectric vibrating reed according to claim 1, further comprising mount electrodes, wherein the mount electrodes are electrically connected to outside circuitry and reside the base.

8. A piezoelectric vibrator comprising:
   the piezoelectric vibrating reed according to claim 1; and
   a package including a base substrate and a lid substrate bonded to each other, which houses the piezoelectric vibrating reed in a cavity between the substrates.

* * * * *